United States Patent
Johnson (10) Patent No.: US 7,763,837 B2
(45) Date of Patent: Jul. 27, 2010

(54) METHOD AND APPARATUS FOR CONTROLLING ANTI-BLOOMING TIMING TO REDUCE EFFECTS OF DARK CURRENT

(75) Inventor: Richard Scott Johnson, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 11/942,771

(22) Filed: Nov. 20, 2007

(65) Prior Publication Data

US 2009/0127436 A1  May 21, 2009

(51) Int. Cl.
*H01L 27/00* (2006.01)
(52) U.S. Cl. .................... 250/208.1; 348/308; 348/313; 348/294
(58) Field of Classification Search ............. 250/208.1; 348/308, 313, 294
See application file for complete search history.

(56) References Cited

U.S. PATENT DOCUMENTS

| | | | |
|---|---|---|---|
| 4,845,566 A | 7/1989 | Sakai et al. | |
| 5,285,091 A | 2/1994 | Hamasaki | |
| 5,880,494 A | 3/1999 | Watanabe | |
| 6,946,352 B2 | 9/2005 | Yaung | |
| 7,205,584 B2 | 4/2007 | Rhodes et al. | |
| 7,492,402 B2* | 2/2009 | Nasu ......................... | 348/308 |
| 2002/0036300 A1 | 3/2002 | Pain et al. | |
| 2002/0100915 A1 | 8/2002 | Hynecek | |
| 2004/0021058 A1 | 2/2004 | Drowley | |
| 2004/0036784 A1 | 2/2004 | Bock | |
| 2005/0083421 A1* | 4/2005 | Berezin et al. .............. | 348/308 |
| 2005/0237404 A1 | 10/2005 | Jerdev et al. | |
| 2005/0280044 A1 | 12/2005 | Bosiers et al. | |
| 2006/0071254 A1 | 4/2006 | Rhodes | |
| 2006/0138581 A1 | 6/2006 | Ladd | |
| 2006/0180741 A1 | 8/2006 | Agranov et al. | |
| 2006/0197114 A1 | 9/2006 | Geshi et al. | |
| 2006/0220070 A1 | 10/2006 | Izawa et al. | |
| 2006/0249731 A1 | 11/2006 | Ladd | |
| 2006/0270096 A1 | 11/2006 | Brady et al. | |

(Continued)

FOREIGN PATENT DOCUMENTS

EP           0854516           7/1998

(Continued)

OTHER PUBLICATIONS

Alistair Kitchen et al., "A Digital Pixel Sensor Array With Programmable Dynamic Range", IEEE vol. 52, No. 12, Dec. 2005, pp. 2591-2601.

(Continued)

*Primary Examiner*—Seung C Sohn
(74) *Attorney, Agent, or Firm*—Ratner Prestia (57) ABSTRACT

An electronic imager includes a plurality of pixels having photosensors for accumulating charge corresponding to individual pixel values of a sensed image. Each of the pixels includes an anti-blooming function which allows charge in excess of a predetermined amount to be drained from the photosensor thus reducing the charge from the pixel that migrates to adjacent pixels. The imager also includes circuitry which controls the anti-blooming function in response to image intensity to reduce dark current in the imager caused by the anti-blooming function.

23 Claims, 8 Drawing Sheets

U.S. PATENT DOCUMENTS

| | | |
|---|---|---|
| 2007/0029637 A1 | 2/2007 | Rhodes et al. |
| 2007/0034914 A1 | 2/2007 | Cole et al. |
| 2007/0045668 A1 | 3/2007 | Brady et al. |
| 2007/0102624 A1 | 5/2007 | Altice, Jr. et al. |
| 2007/0102781 A1 | 5/2007 | Ladd |

FOREIGN PATENT DOCUMENTS

| | | |
|---|---|---|
| EP | 0921676 | 6/1999 |
| EP | 1648160 | 4/2006 |
| JP | 4079582 | 3/1992 |
| JP | 9199704 | 7/1997 |
| JP | 2006024907 | 1/2006 |

OTHER PUBLICATIONS

Orly Yadid-Pecht et al., "In-Pixel Autoexposure CMOS APS", IEEE, vol. 38, No. 8, Aug. 2003, pp. 1425-1428.

Michael Schanz et al., "Smart CMOS Image Sensor Arrays", IEEE, vol. 44, No. 10, Oct. 1997, pp. 1699-1705.

TC255P 336-×244-Pixel CCD Image Sensor, Texas Instruments, Jun. 1996, Revised Mar. 2003, pp. 1-17.

SN28835 ½-Inch NTSC Timer, Texas Instruments, Feb. 1991, pp. 1-16.

Charge-coupled device, Wikipedia Encyclopedia, pp. 1-5.

Active pixel sensor, Wikipedia Encyclopedia, pp. 1-4.

Charge-Coupled Device (CCD) Image Sensors, Eastman Kodak Company, pp. 1-13.

Schlinatus, Dana, Authorized Officer, International Search Report and Written Opinion of the International Searching Authority, PCT/US2008/083303, Feb. 17, 2009.

Charge-coupled device, Wikipedia Encyclopedia, pp. 1-5, Jun. 2007.

Active pixel sensor, Wikipedia Encyclopedia, pp. 1-4, Jun. 2007.

Charge-Coupled Device (CCD) Image Sensors, Eastman Kodak Company, pp. 1-13, Nov. 2007.

\* cited by examiner

METHOD AND APPARATUS FOR CONTROLLING ANTI-BLOOMING TIMING TO REDUCE EFFECTS OF DARK CURRENT

BACKGROUND OF THE INVENTION

The present invention concerns semiconductor imaging devices and, in particular, such devices having anti-blooming features.

A semiconductor imaging device typically includes an array of pixel cells for capturing an image. Each pixel cell includes a photo-sensor which collects photoelectrons generated during an exposure time when the electronic imager is capturing an image. During the exposure time, the photo-sensor accumulates electric charge, (i.e. electron-hole pairs) in response to impinging photons.

In one example, an electronic imager may include an array of complimentary metal-oxide semiconductor (CMOS) active pixel sensor (APS) pixel cells. CMOS pixel cells typically consist of a photo-diode for photocurrent generation, a reset transistor for resetting accumulated charge produced by the photo-diode and a readout circuit composed of one or more of transistors for translating the accumulated electric charge into a readout voltage. It is known that photocurrent generation efficiency of an electronic imager increases when the photo-diode exposure area of the pixel cell is increased. Therefore, it is desired for the readout circuitry and other non-photocurrent generating hardware to consume as little area as possible in the pixel cell. One solution is an imager wherein multiple pixel cells share readout circuitry.

Electronic imagers may also use charged coupled device (CCD) pixel cells. The CCD architecture typically consists of a photoactive region for photocurrent generation, and a serial readout shift register for reading the pixel cell values.

One drawback to a typical pixel cell architecture is blooming. Blooming is a deteriorating effect on the captured image that occurs when a photo-diode or photoactive region in a pixel cell is saturated and excess electric charge spills into adjacent photo-diodes or photoactive regions, thus corrupting their ability to correctly capture an image. Blooming is typically prevented by an anti-blooming (AB) circuit that allows the excess electric charge to flow to a reference potential away from the adjacent photo-diodes.

Anti-blooming circuitry for CCD arrays may include a lateral overflow drain (LOD) built into the pixel cell. AB is performed by the LOD wherein excess charge is attracted to a potential applied to the LOD rather than spilling into adjacent pixel cells. For APS pixels, the floating diffusion may function in a manner similar to the LOD. In these devices, the floating diffusion is held at a reference potential during the integration period so that excess charge from the photodiode spills into the floating diffusion rather than into adjacent pixels.

Another common problem in electronic imagers is dark current. Dark current results in extraneous charge being collected by the pixel cells even when the imager is not exposed to light and, thus, erroneous pixel values being generated. One source of dark current is leakage in the charge collection region of a photodiode, which is strongly dependent on the doping implantation conditions. Dark current may also be caused by current generated from trap sites inside or near the photodiode depletion region; band-to-band tunneling induced carrier generation as a result of high fields in the depletion region; and junction leakage coming from the lateral sidewall of the photodiode. For both of these devices, an anti-blooming barrier having a potential close to that of a saturated photosensor (e.g. a CCD photogate or APS photo-diode) allows excess charge to spill into the LOD or into the floating diffusion before it spills into neighboring pixels.

DETAILED DESCRIPTION OF THE INVENTION

An electronic imager typically includes an array of pixel cells for capturing an image. Each pixel cell includes a photo-sensor for photocurrent generation during an integration time when the electronic imager is capturing an image. During the integration time, the photo-sensor accumulates electric charge in response to impinging photons.

In one example, an electronic imager may consist of complimentary metal-oxide semiconductor (CMOS) active pixel sensor (APS) pixel cells. As described above, CMOS pixel cells typically consists of a photo-diode for photocurrent generation to generate an accumulated charge and a floating diffusion to store the charge accumulated by the photodiode. Although photo charges are generated as electron-hole pairs, it is the accumulation of the photoelectrons in the reverse-biased photodiode that produces the pixel values addressed here. In addition, a CMOS APS pixel may include a reset transistor for resetting accumulated charge produced by the photo-diode and a readout circuit having one or more transistors for translating the electric charge into a readout voltage. As described above, it is desirable for the readout circuitry and other non-photocurrent generating hardware to use as little area as possible in the pixel cell. One way to increase the relative area occupied by the photodiode is for multiple pixel cells to share readout circuitry and other hardware which is multiplexed among the shared pixels.

Figure 1:
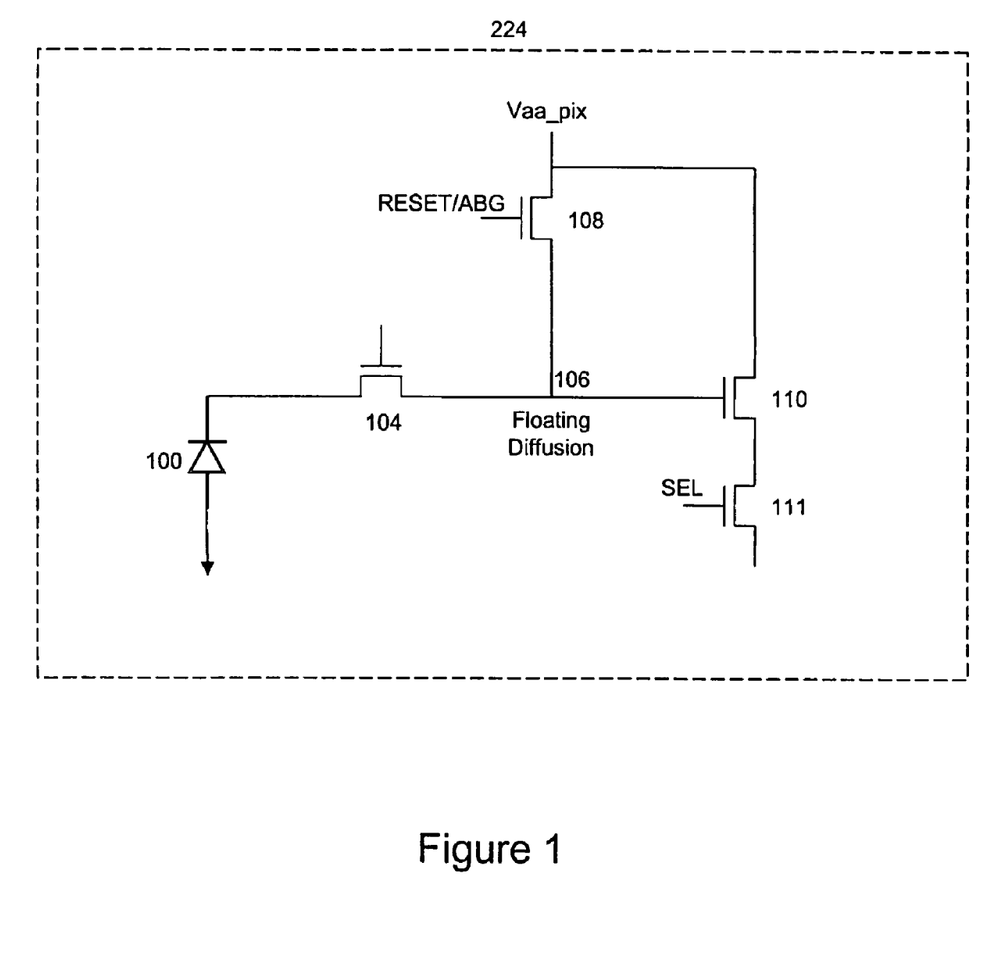
FIG. 1 is a schematic diagram of an exemplary APS pixel suitable for use with an embodiment of the invention.

FIG. 1 shows a four transistor (4T) architecture of a CMOS pixel cell 124 including: photo-diode 100 for photocurrent generation; transfer transistor 104 for transferring the electric charge from photo-diode 100 to floating diffusion 106 for electric charge storage; RESET/AB transistor 108 for applying a reference potential, Vaa-pix, to floating diffusion 106; source follower transistor 110 for translating the electric charge stored in floating diffusion 106 to a pixel output voltage and a select transistor 111 which provides the selected pixel signal to image processing circuitry. In a shared pixel configuration, the floating diffusion 106 and source follower transistor 110 may be shared among multiple pixels, where each pixel includes at least a photodiode and a transfer transistor. In this configuration, the signals applied to the transfer transistor 104 and the select transistor 111 are synchronized to provide each pixel in the share group at an appropriate time.

Operation of the 4T architecture is now described in reference to FIG. 1. Although FIG. 1 shows a 4T structure, the same analysis applies to pixels which share a floating diffusion and read-out circuitry (e.g. 2.5T, 1.75T and 1.5T pixels). Pixels that share a floating diffusion typically include a dedicated photodiode and transfer transistor. The floating diffusion, reset transistor and source-follower transistor are shared among the pixels in a time-division multiplex scheme so that each pixel in the shared group may be read at a respectively different time. For the sake of simplicity, the following discussion concerns a 4-T or 5-T pixel having a dedicated floating diffusion and dedicated reset, amplification and select transistors. It is contemplated, however, that the invention may be practiced using multiplexed pixels.

Prior to the beginning of the integration period, the photodiode 100 and floating diffusion 106 are reset by turning on both the reset transistor 108 and the transfer transistor 104. At the end of the reset period, the gate of transfer transostor 104 is set to an anti-blooming potential and, if the reset transistor 108 is also being used as an anti-blooming transistor, transistor 108 remains turned on. In one example pixel, the anti-blooming potential applied to the gate of the transfer transistor 104 may be one threshold voltage ($V_t$) greater than the maximum charge potential that is to be accumulated on the photodiode ($V_{min}$, e.g. ground), where $V_t$ is the difference between the gate potential and the source potential at which transfer transistor 104 becomes conductive.

This potential represents an anti-blooming barrier. In this example, if the charge on the photodiode is greater than ground potential (i.e. not saturated), there will be no leakage of charge through the main channel of transfer transistor 104. Leakage will occur only when the potential on the photodiode 100 is less than or equal to ground potential. For example, the anti-blooming potential may be ground $+V_t$. Because the floating diffusion 106 is held at the reset potential (e.g. +3.5V), excess photoelectrons accumulated by the photodiode 100, or other photodiodes (not shown) sharing the floating diffusion 106, leak through the transfer transistor 104 to the floating diffusion, preventing the charge accumulated on the photodiode from reaching ground potential and thus, limiting pixel blooming.

During the integration period, electrons accumulate on photo-diode 100. Once the integration period has concluded, RESET/AB transistor 108 is turned off and transfer transistor 104 is turned on allowing the accumulated charge to be transferred from the photodiode 100 to the floating diffusion 106 for storage. To ensure that the charge is completely transferred from the photodiode 100 to the floating diffusion 206, the example pixel uses a pinned photodiode as the photodiode 100. The pinned photodiode is "pinned" to a potential less than the reset potential of the floating diffusion 106, causing the accumulated photoelectrons to preferentially flow from the photodiode 100 to the floating diffusion 106.

The stored charge of floating diffusion 106 is then translated to a voltage signal by source follower transistor 110. The voltage signal which is representative of the accumulated electric charge, is used along with voltage signals from other pixels to generate a signal representing the captured image. After the voltage signal provided by the source follower transistor 110 has been read, and while transfer transistor 104 is on, RESET/AB transistor 208 is turned on to reset floating diffusion 106 and photo-diode 100 as described above.

Figure 3:
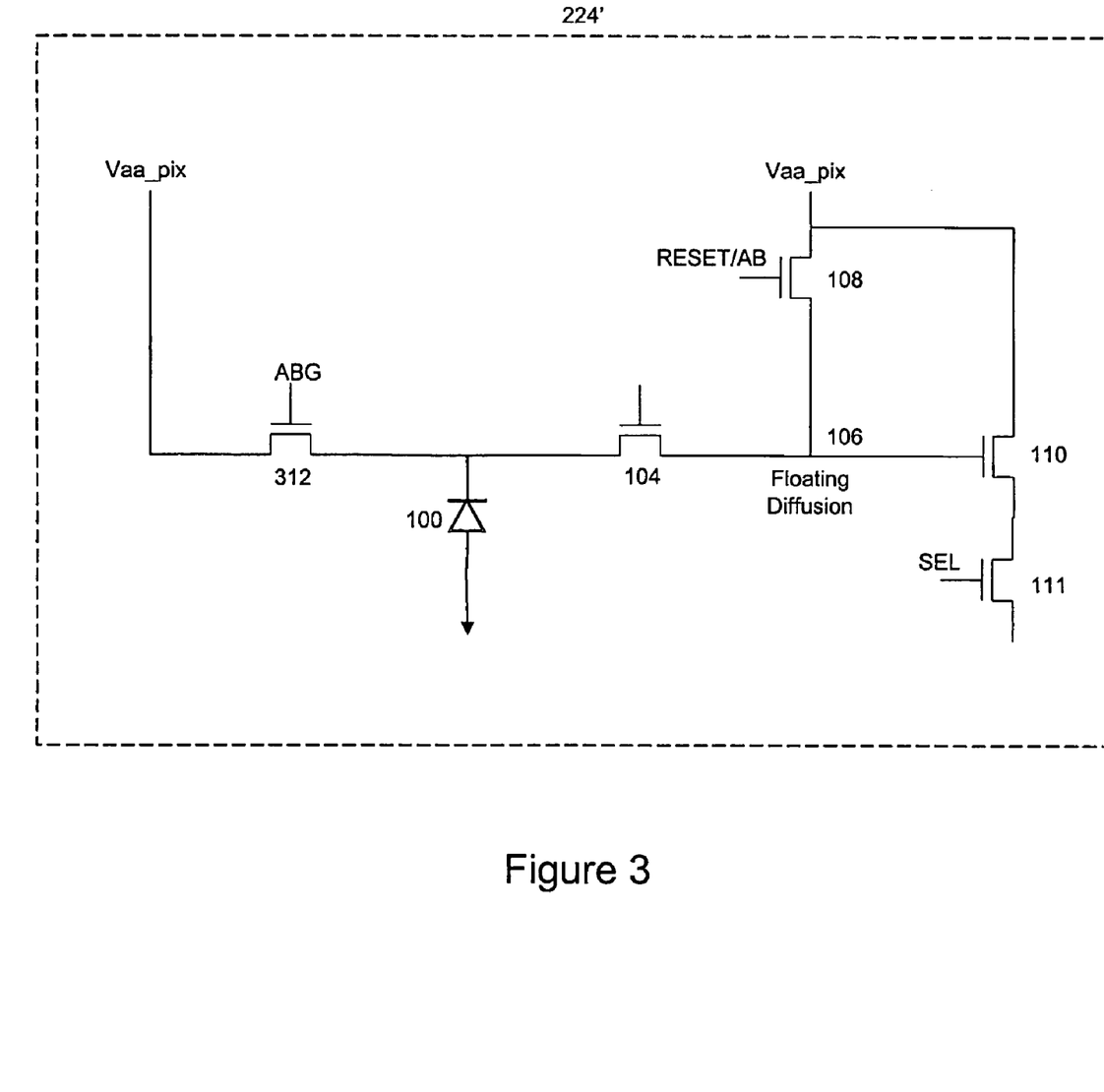
FIG. 3 is a schematic diagram of another exemplary APS pixel suitable for use with an embodiment of the invention.

In the 4T architecture, a single transistor 108 is used both to reset the charge on photo-diode 100 and floating diffusion 106 and to perform anti-blooming (AB). By adding a fifth transistor, it is possible to have a dedicated reset transistor and a dedicated AB transistor. FIG. 3 shows a five transistor (5T) architecture of a CMOS pixel cell 224' that includes all of the elements of the 4T architecture with the addition of a fifth AB transistor 312. The operation of the pixel shown in FIG. 3 is the same as that shown in FIG. 1 except that, during the integration period, the reset transistor 108 and the transfer transistor 104 are turned off and the gate ABG which is the control terminal of transistor 312 is held at ($V_{min}+V_t$). Also, at the end of the integration period, the reset transistor 108 is turned on while the transfer transistor 104 is turned off to reset the floating diffusion before the accumulated charge on the photodiode is transferred to the floating diffusion 106.

A structure similar to the 5T structure may be used in configurations in which the floating diffusion 106, reset transistor 108, source follower transistor 110 and select transistor 111 are shared among multiple pixels. In these embodiments, however, each pixel would have an AB transistor 312 in addition to the photodiode 100 and the transfer transistor 104.

Although anti-blooming circuitry is beneficial in eliminating blooming in a captured image it also has a drawback: it may increase dark current. In traditional CMOS or CCD imager systems, AB is performed without consideration of the image being captured. AB is desired in some light conditions and while in other light conditions it is unnecessary. For example, in images with relatively low-intensity light characteristics it is unlikely that the photo-diodes will saturate and thus that blooming effects will be noticeable. Because pixel levels are relatively low, however, dark current will be noticeable. The opposite is also be true for images captured under relatively high-intensity light characteristics. Furthermore, dark current is less noticeable in images captured under high-intensity light characteristics. Therefore, a problem arises in traditional systems since AB techniques are employed without consideration of the light characteristics of the image. A technique for controlling an AB feature of an imager based on the light characteristics of the image being captured would be beneficial.

As described above, dark current may have many sources and may depend not only on the voltages applied to the imager but on the processes used to form the imager. Thus, both the anti-blooming voltage applied to the gate of the transfer transistor 104 or to the gate of the anti-blooming transistor 312 and the voltage applied to the floating diffusion 106 or to the drain of the anti-blooming transistor 312 may affect the dark current in the pixel. Consequently, it may be desirable to control both the anti-blooming voltage and the reset potential in order to decrease both dark current distortion and blooming.

Figure 2:
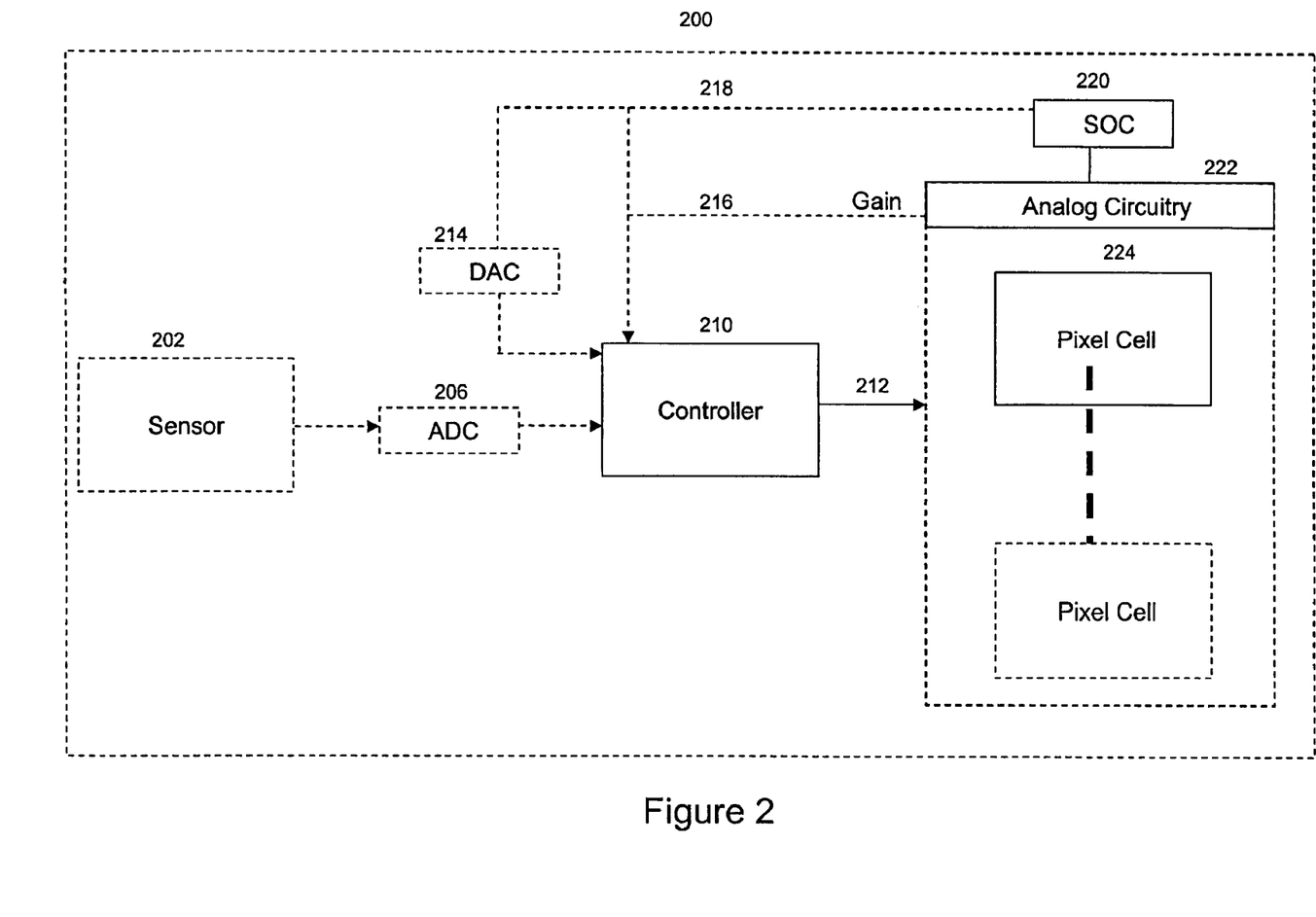
FIG. 2 is a block diagram of an exemplary imaging circuit that may include an embodiment of the invention.

An example embodiment of an electronic imager system with AB control is shown in FIG. 2. The imager system 200 includes: pixel cells 224 for photocurrent generation and translation of the electric charge into a pixel voltage; analog circuitry 222 for amplifying and digitizing the voltage signals from the pixel cells; system on chip (SOC) 220 for performing image processing functions on the digitized pixel values from the analog circuit; an optional sensor 202 for measuring a light intensity; a controller 210 for controlling an AB feature of the pixel cell; optional analog to digital converters (ADCs) 206; and optional digital to analog converter (DAC) 214.

Figure 4:
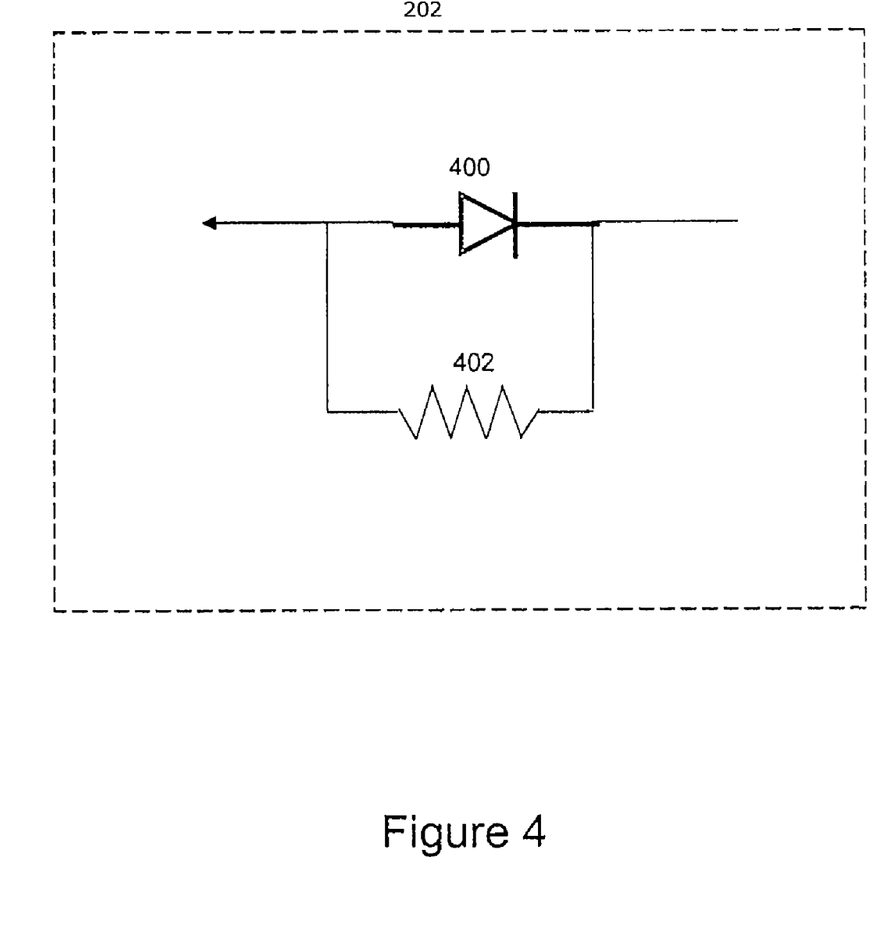
FIG. 4 is a schematic diagram of an exemplary sensor circuit suitable for use with an embodiment of the invention.

During exposure, system 200 measures the light intensity of the image being captured and controls the AB feature of the pixel cells so that AB is applied only when a relatively high light intensity is detected. One way to measure the light intensity uses at least one pixel cell 224 of the imager. Another way uses at least one dedicated sensor 202. Sensor 202 may comprise a photo-diode, photo-transistor, photo-resistor or some other photo-current generating or modulating device that is separate from pixel cell 224. One example is shown in FIG. 4 as photo-diode 400 in parallel with resistor 402. During exposure to high-intensity light, photo-current generation is performed by photo-diode 400. During exposure to low-intensity light, accumulated charge from photo-diode 400 is dissipated through resistor 402 to ensure accurate tracking of incident illumination. Sensor 202 may be connected directly to controller 110 or through ADC 106 if controller 210 is a digital controller.

Another way in which the light intensity may be measured is from the analog circuitry 222. To ensure that images are properly digitized, the circuitry 222 may include an automatic gain control (AGC) function (not shown). The AGC controls the output signal of analog amplifiers (not shown) in the analog circuitry 222 so that the signals applied to ADCs (not shown) in the analog circuitry 222 are kept within a predetermined range. AGC circuitry typically includes a voltage-controlled amplifier (not shown) that is controlled by a Gain signal. This Gain signal may be used as a measure of overall light intensity. When the Gain signal is low, light intensity is high and vice-versa. In the example embodiment shown in FIG. 2, the Gain signal 216 is applied to the controller 210 either directly or through optional DAC 214.

A third possible way to measure light intensity is to use a function on the SOC 220. SOC 220 may, for example, generate a histogram of pixel intensities for an image in order to control image processing. If an image includes more than a threshold number of bright pixels, as determined by this histogram, the SOC may provide a signal either directly to the pixel circuitry 124 or to the controller 210 to control the AB function of the imager 200.

During charge integration, the measured intensity signal may be provided to controller 210 for processing and control of the AB function. The gate of the AB transistor 312, shown in FIG. 3, or of the transfer transistor 104 (shown in FIG. 1) is set to an anti-blooming potential (e.g. $V_{min}+V_t$) when the intensity signal exceeds the threshold and is turned off when the signal does not exceed the threshold. As described below, the controller 210 may also adjust the voltage applied to the floating diffusion 106 in FIG. 1 or to the drain of the anti-blooming transistor 312 during the integration interval based on the relative intensity of the image. For an image having high intensity illumination, it may be desirable for this voltage to be relatively high, at or close to the reset voltage. This ensures that any excess charge can be quickly moved out of the photodiode. For lower intensity images, it may be desirable to reduce the AB voltage in order to reduce the electric fields generated in the imager and, so, reduce the dark current. In the exemplary embodiment of the invention, the controller 210 adjusts the potential applied to the gate electrode of the reset transistor 108, shown in FIG. 1 to adjust this voltage. It may also adjust the AB voltage applied to the drain electrode of the anti-blooming transistor 312 during the integration period to achieve a similar result. This voltage may be controlled in addition to controlling the anti-blooming voltage applied to the gate electrodes of the transfer transistor 104 in FIG. 1 or the anti-blooming transistor 312 in FIG. 3.

Figure 5:
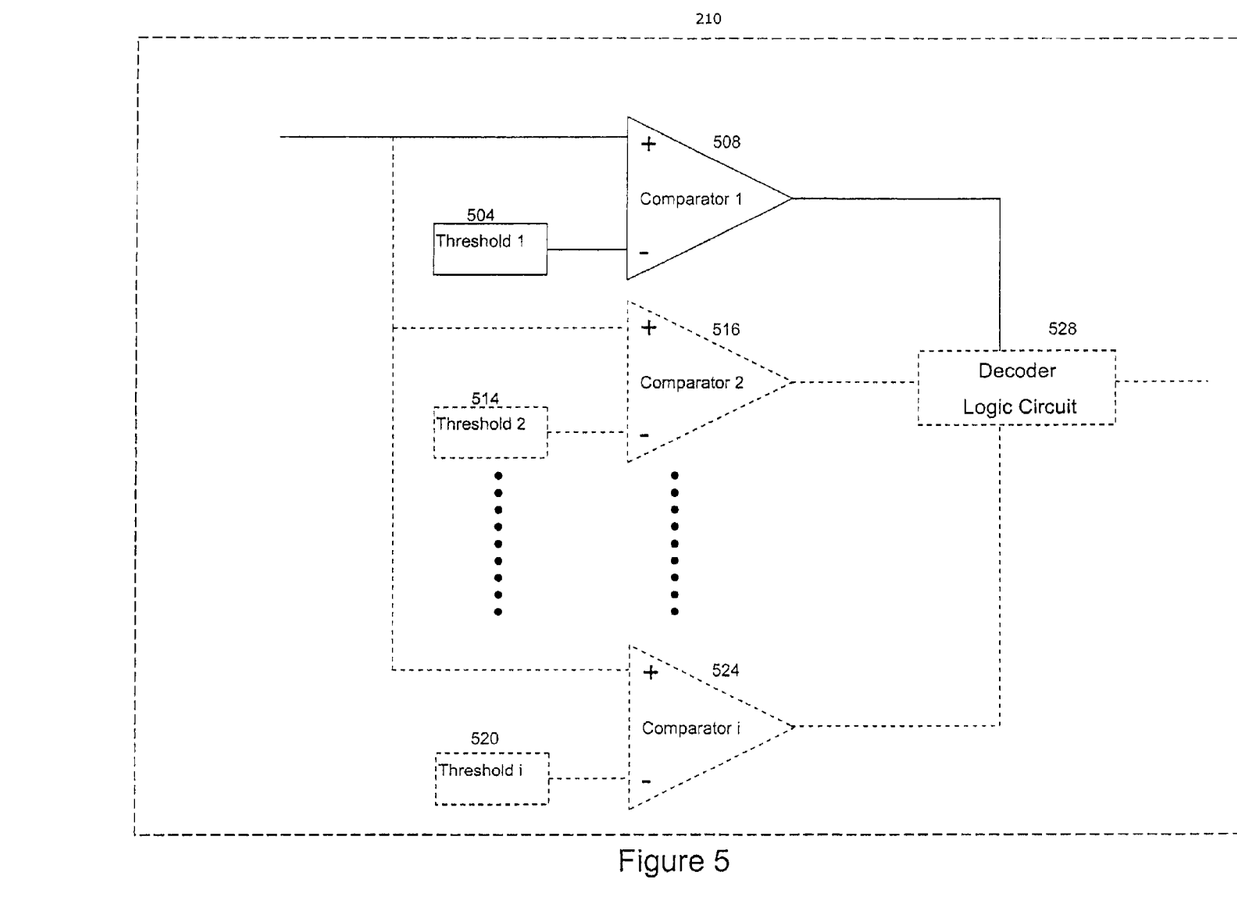
FIG. 5 is a block diagram of an exemplary controller circuit suitable for use with an embodiment of the invention.

One example of controller 210 is a circuit including at least one comparator 508 as shown in FIG. 5. The light intensity signal is applied to the comparator 508 and possibly to other comparators 516 and 524. The light intensity signal is compared to at a threshold 504 and possibly to other thresholds 514, and 520. When multiple thresholds are used, comparators 508, 516 and 524 provide output signals to decoder circuit 528. Example decoder 528 is used to determine the range of the light intensity and to provide a control signal 530 which controls the anti-blooming voltage applied to the gate electrodes of the reset transistors 108 to control the voltage applied to the floating diffusion during the integration interval. When a single comparator is used, the controller 210 may control the potential applied to the gate electrodes of the transistors 104 and 312 and the anti-blooming voltage applied to the gate of the reset transistor 108 to either turn on or turn off the anti-blooming feature.

In the example embodiment, some potential may be applied to the floating diffusion 106 or to the drain of the anti-blooming transistor 312 when the anti-blooming function is disabled. This potential may be determined, for example, by the configuration of the pixel or the process steps used to make it. It is a potential which produces the best dark current performance for the pixel. In a typical pixel, for example, this potential may be slightly negative, i.e. slightly less than ground potential, one exemplary range of values may be between −0.05V and −0.1V.

When multiple comparators are used, the controller 210 may also control the gate electrode of transistor 108 to control voltage applied to the floating diffusion 106 or control the voltage applied to the drain of anti-blooming transistor 312 in FIG. 3, in discrete steps such that a higher voltage is applied for higher light-intensity images than for lower light-intensity images. The AB voltage applied to the drain electrode of transistor 312 may be controlled, for example, by modulating the conductivity of a field effect transistor (not shown) in series with the transistor 312.

Figure 6:
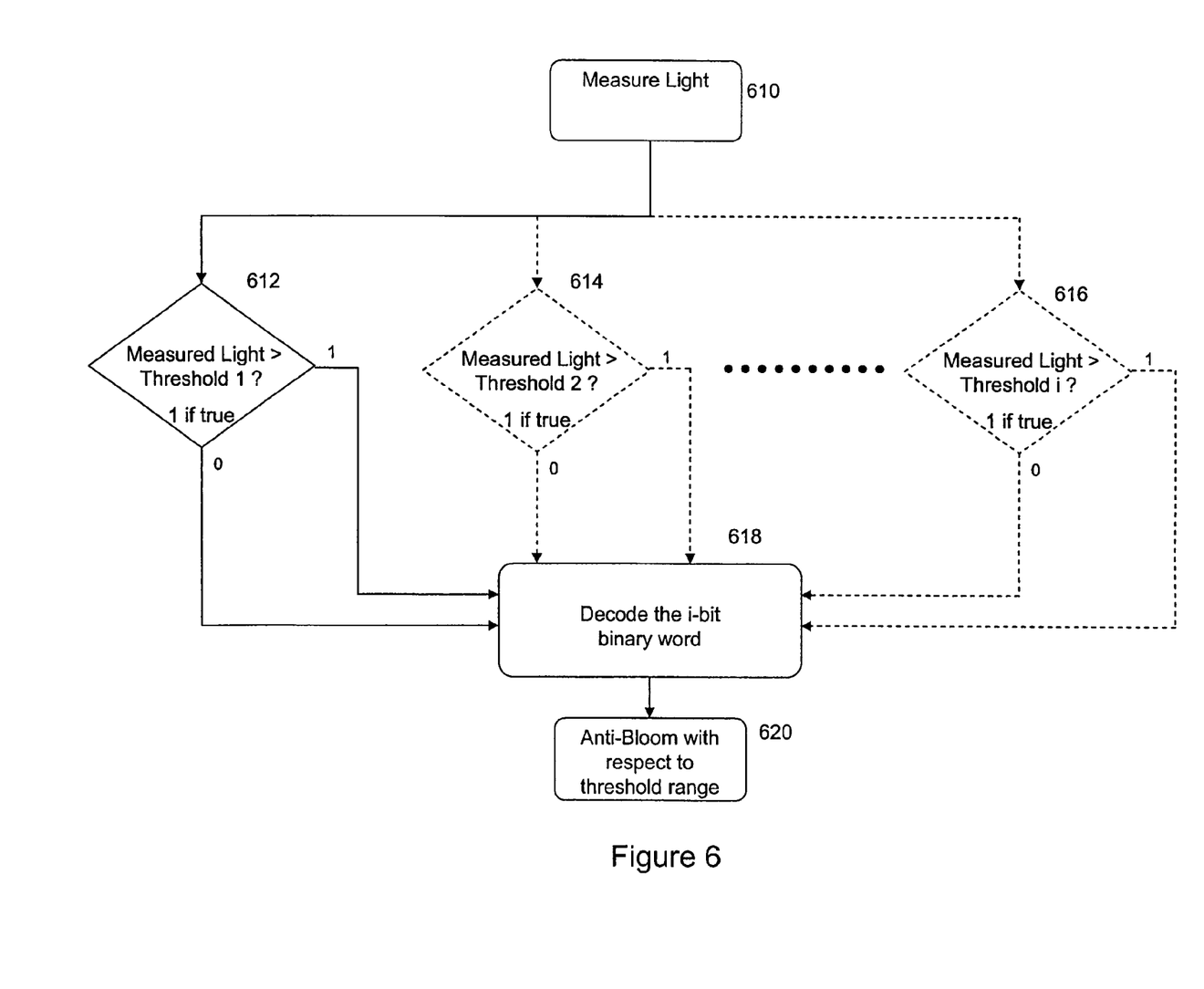
FIGS. 6, 7 and 8 are flow-chart diagrams that are useful for describing the operation of embodiments of the invention.

The AB control procedure is now described with reference to FIG. 6. The light incident on the imager is measured either by sensor 102 or is provided by the analog circuitry 222 or the SOC 220, at step 610. this intensity value is then compared to threshold 1 and optionally to thresholds 2 through i at steps 612, 614 and 616. When a single comparator is used, the output signal of the comparator 508 turns the anti-blooming function on or off. When multiple comparators are used, the binary output signals of the comparisons are then decoded at step 618 to find the light intensity range. The level of the voltage applied to the gate electrode of the reset transistor 108 or to the drain of the anti-blooming transistor 312 is then set at step 620 with respect to the decoded threshold range.

Alternatively, Controller 110 may be a micro-controller. The micro-controller, for example, may calculate a mean value, maximum value, minimum value or some other statistical value based on the measured light intensity during a predetermined interval, for example, an image frame interval. This metric may then be compared to at least one threshold value and a decision may be made in response to the comparison and appropriate control signals may be provided to the pixel cells 124 via the control signal(s) 212. The level of AB is controlled, as described above, corresponding to statistical voltage in a threshold range.

Figure 7:
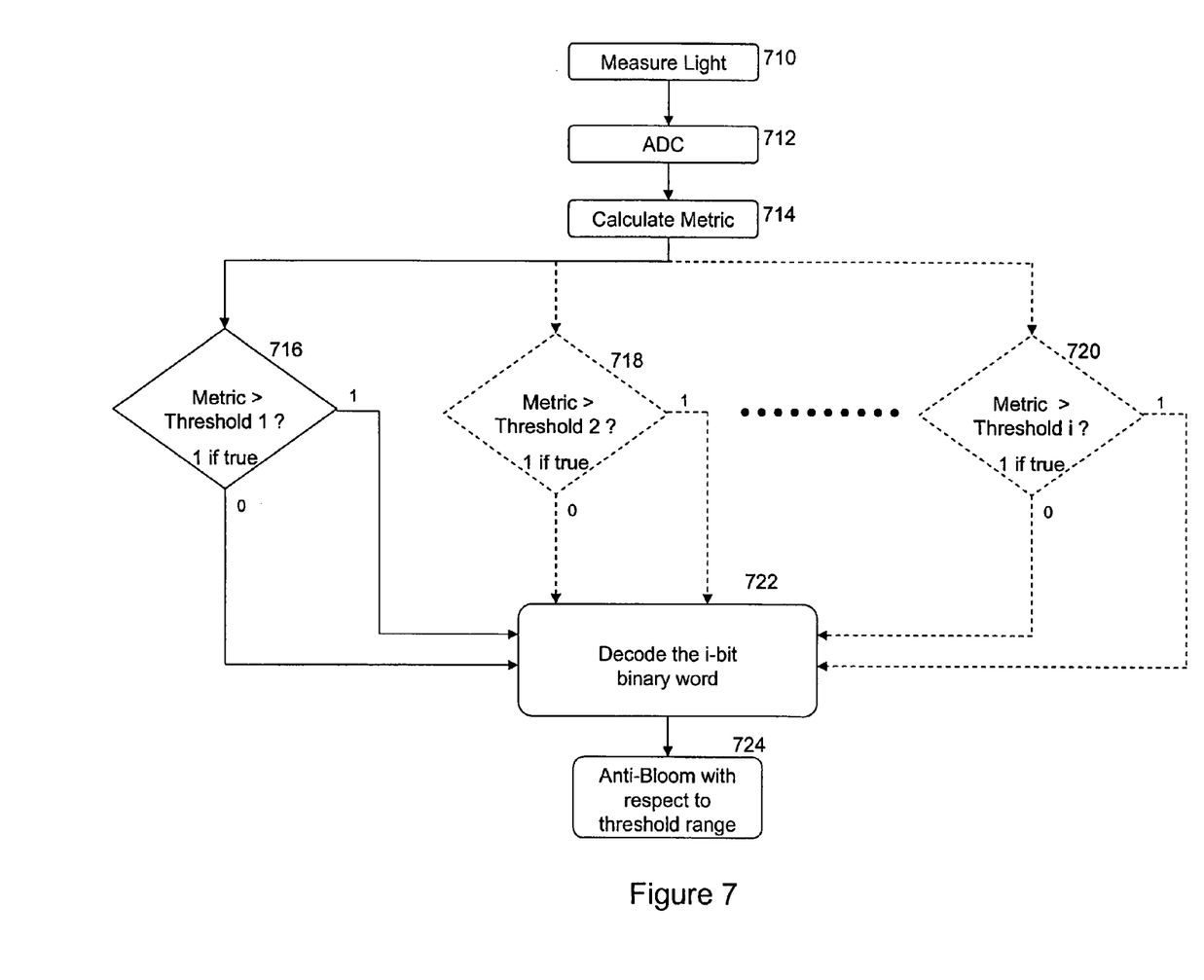

The AB control procedure for the example micro-controller is now described in reference to FIG. 7. Light intensity is measured at step 710 and then converted to a digital representation at step 712. The digital signal is then used to calculate a statistical metric, at step 714, as described above. The statistical metric is compared to threshold 1 and, optionally to thresholds 2 through i, at steps 716, 718 and 720. The binary outputs of the comparisons are then decoded at step 722 to determine the statistical threshold range. The level of AB may then be set with respect to the determined statistical threshold range.

As described above, during normal pixel read-out of an image, low level pixel values corresponding to low light images may be amplified by analog circuitry 222. In some instances, it may be desirable to control the AB voltage in inverse proportion to the amplification provided by analog circuitry 222 (i.e. to provide a relatively high AB voltage when the gain signal is low and to provide a relatively low AB voltage when the gain signal is high). In this instance, controller 210 may include a differential amplifier. Analog circuit 222 may provide a Gain signal to controller 210.

Figure 8:
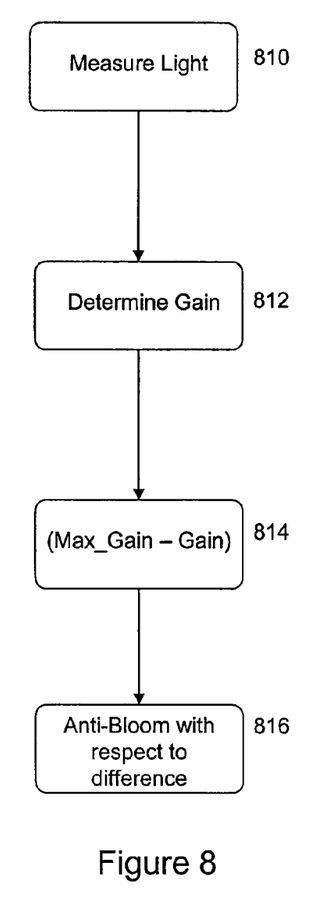

Operation of the differential amplifier controller is now described with reference to FIG. 8. At step 810, the light intensity is measured and the Gain signal is then determined in the analog circuit 222. This Gain signal may be determined, for example, in response to an average illumination level determined over an entire image or by the SOC 220, which may perform a histogramming function on the image to control the Gain signal. The Gain signal may be applied to the negative input terminal of the differential amplifier while the max gain value is applied to the positive input terminal. The Gain signal is then subtracted from the maximum possible gain and AB is controlled with respect to the gain difference. In one example system, the gain difference signal may be appropriately scaled and applied to the gate of the reset transistor 108 during the integration interval to control blooming without producing excess dark current.

System on chip (SOC) 202 is another option that can be used for AB control. SOC 202 can operate on the measured light intensity or amplification level of analog circuit 222. SOC 202 can furthermore perform digital calculations and threshold comparisons in a similar manner to controller 210. The digital nature of SOC 220 may require a digital to analog converter 214 in to convert the digital AB control signal into one or more analog AB control signals to be applied to the pixel cells 224.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. An imager comprising:
   at least one photosensor for accumulating charge in response to intensity of light impinging on the photosensor during an integration period;
   an anti-blooming (AB) transistor comprising, a main channel coupled between the photosensor and a source of reference potential, a control terminal for varying a conductance of the main channel dependent on a control signal applied to the control terminal; and
   a control circuit configured to set and hold the reference potential at a level determined by a detected light intensity during the integration period.

2. The imager of claim 1 wherein:
   the control circuit is configured to compare the detected light intensity to a threshold value, to increase the reference potential when the detected light intensity exceeds the threshold value and to decrease the reference potential when the detected light intensity does not exceed the threshold value.

3. The imager of claim 2 wherein,
   the control circuit includes a comparator circuit for comparing the detected light intensity to the threshold value.

4. The imager of claim 2 wherein:
   the control circuit is configured to compare the detected light intensity to a threshold value, to apply the reference potential to the control terminal of the AB transistor when the detected light intensity exceeds the threshold value and not to apply the reference potential to the control terminal of the AB transistor when the detected light intensity does not exceed the threshold value.

5. The imager of claim 1 including:
   a light intensity sensor coupled to the control circuit for generating an intensity signal representing the detected light intensity, wherein the light intensity signal is applied to the control circuit.

6. The imager of claim 5 wherein,
   the at least one photosensor is a plurality of photosensors; and
   the light intensity sensor includes at least one of the plurality of photosensors of the imager.

7. The imager of claim 6 wherein,
   the imager includes a microcontroller configured to calculate a statistical metric based on light intensity detected by the plurality of photosensors; and
   the microcontroller is configured to compare the statistical metric to the threshold.

8. The imager of claim 5 wherein,
   the light intensity sensor is an further photosensor separate from the at least one photosensor of the imager.

9. An imager comprising:
   a plurality of pixel elements arranged in an array of rows and columns, each pixel element including:
   a photodiode;
   a floating diffusion; and
   a transfer transistor having a conductive channel, coupled between the photodiode and the floating diffusion, and a control electrode for controlling a conductivity of the conductive channel;
   a control circuit coupled to the control electrode to selectively apply a control signal to the control electrode at a value, the value being held during an integration interval in which the photodiode is integrating charge, the value of the control signal being $V_{min}+V_t$, where $V_{min}$ is a potential on the photodiode when the photodiode is saturated and $V_t$ is a threshold voltage for the transfer transistor;
   wherein the control circuit is responsive to a detected light intensity to apply the control signal to the control electrode when the detected light intensity is greater than a threshold value and to apply a further control signal having a value not greater than $V_{min}$ when the detected light intensity is less than the threshold value, and
   a reset transistor having a conductive channel coupled between a source of reset potential and the floating diffusion and a reset control electrode for controlling the conductivity of the conductive channel;
   wherein the control circuit is configured to selectively apply an anti-blooming control signal to the reset control electrode at a first level when detected light intensity is less than a first threshold, to apply the anti-blooming control signal to the reset control electrode at a second level when the detected light intensity exceeds the first threshold and is less than a second threshold, and to apply the anti-blooming control signal to the reset control electrode at a third level when the detected light intensity exceeds the second threshold during the integration period.

10. The imager of claim 9, wherein the anti-blooming control signal at the first level has a value which reduces dark current in the imager.

11. The imager of claim 9 wherein the control circuit is configured to set and hold the anti-blooming control signal at the first level when the light intensity signal is less than the first threshold value, set and hold the anti-blooming control signal at the second level when the light intensity signal is greater than the first threshold but less than the second threshold value, set and hold the anti-blooming control signal at the third level when the light intensity signal is greater than the second threshold, the control signal at the first level causing the conductive channel of the reset transistor to be at a first conductive level, the control signal at the second level causing the conductive channel of the reset transistor to be at a second conductive level, and the control signal at the third level causing the conductive channel of the reset transistor to at a third conductive level, wherein the second conductive level is more conductive than the first conductive level, and the third conductive level is more conductive than the second conductive level.

12. The imager of claim 9 further comprising:

image processing circuitry coupled to the array of pixel elements for processing signals provided by the array of pixel elements to produce an image signal, the image processing circuitry including histogramming circuitry which develops a histogram of image brightness and circuitry coupled to the histogramming circuitry to produce a count of pixel values having an intensity greater than an intensity threshold value;

wherein the controller is responsive to the pixel count value provided by the image processing circuitry as the light intensity signal.

13. The imager of claim 9 further comprising:

a photosensor, coupled to the controller and separate from the array of photodiodes, the photosensor providing the light intensity signal to the controller.

14. The imager of claim 13, wherein the photosensor is selected from a group consisting of a photodiode, a phototransistor and a photo-resistor.

15. An imager comprising:

a plurality of pixel elements arranged in an array of rows and columns, each pixel element including:

a photodiode;

a floating diffusion; and a reset transistor having a conductive channel coupled between a source of reset potential and the floating diffusion and a control electrode for controlling the conductivity of the conductive channel;

analog processing circuitry including a gain signal, the gain signal having a relatively low value when the detected light intensity is relatively high and a relatively high value when the detected light intensity is relatively low; and a control circuit including a differential circuit configured to subtract the gain signal from a maximum gain signal, representing a maximum value of the gain signal, to produce a blooming control signal for the control electrode of the reset transistor, wherein the control circuit is configured to apply the blooming control signal to the control electrode of the reset transistor at a first level when the detected light intensity is less than a first threshold, at a second level when the detected light intensity exceeds the first threshold and is less than a second threshold, and at a third level when the detected light intensity exceeds the second threshold, and holding the blooming control signal at a constant level during an integration interval in which the photodiode is exposed to light.

16. An imager comprising:

a plurality of pixel elements arranged in an array of rows and columns, each pixel element including:

a photodiode; and an anti-blooming transistor having a conductive channel, coupled between the photodiode and a source of reference potential, and a control electrode for controlling a conductivity of the conductive channel; and a control circuit coupled to the control electrode to selectively apply a control signal to the control electrode at a value, the value being held during an integration interval in which the photodiode is integrating charge, the value of the control signal being $V_{min}+V_t$, where $V_{min}$ is a potential on the photodiode when the photodiode is saturated and $V_t$ is a threshold voltage for the transfer transistor;

wherein the control circuit is responsive to a detected light intensity to apply the control signal to the control electrode when the detected light intensity is greater than a threshold value and to apply a further control signal having a value not greater than $V_{min}$ when the detected light intensity is less than the threshold value, and wherein the control circuit is configured to set and hold the reference potential at a level determined by the detected light intensity during the integration period.

17. A method for controlling blooming in an electronic imager, the imager includes a plurality of pixels, each pixel having a conductive path from a photo-sensor of the pixel to a source of reference potential and a control electrode for controlling a conductivity of the conductive path, the method comprising:

sensing an intensity of an image being captured by the electronic imager; and setting and holding the reference potential at a level based on the sensed intensity of the image during an integration period.

18. The method of claim 17 further comprising:

selectively applying a control signal to the control electrode, during an integration interval in which the photosensor is integrating charge, the control signal having a value approximately equal to a potential of a saturated photosensor;

comparing the sensed intensity to a threshold value to apply the control signal when the sensed intensity is greater than the threshold; and applying a further control signal to the control electrode when the sensed intensity is less than the threshold, wherein the further control signal biases the conductive path to be non-conductive.

19. The method of claim 18, wherein the step of applying the further control signal includes the step of applying the further control signal which reduces dark current in the imager.

20. The method of claim 17, further comprising, calculating a statistical metric based on the sensed intensity of the image, and comparing the statistical metric to the threshold value to change the reference potential based on the statistical metric.

21. The method of claim 20, wherein the step of calculating the statistical metric includes calculating a histogram of the sensed intensity of the image and generating a signal representing a count of the pixel values that are greater than a threshold pixel value, and providing the count value as the statistical metric.

22. The method of claim 17, wherein:

the step of changing the reference potential based on the sensed intensity of the image includes:

setting and holding the reference potential to a relatively high value when the sensed intensity indicates a relatively high-intensity image; and setting and holding the reference potential to a relatively low value when the sensed intensity indicates a relatively low-intensity image; and the method further comprises:

comparing the sensed intensity to a further threshold value less than the threshold value; and setting and holding the reference potential to an intermediate value, between the relatively high value and the relatively low value when the sensed intensity is greater than the further threshold value and less than the threshold value.

23. The method of claim 17, further comprising:
calculating a gain signal value, the gain signal value being relatively low when the sensed intensity of the image is relatively high and being relatively high when the sensed intensity of the image is relatively low;
wherein the step of changing the reference potential based on the sensed intensity of the image includes changing the reference potential in inverse proportion to the gain signal.

* * * * *